United States Patent
Lin et al.

(10) Patent No.: US 11,876,118 B2
(45) Date of Patent: Jan. 16, 2024

(54) SEMICONDUCTOR STRUCTURE WITH GATE METAL LAYER

(71) Applicant: Vanguard International Semiconductor Corporation, Hsinchu (TW)

(72) Inventors: Shin-Cheng Lin, Tainan (TW); Cheng-Wei Chou, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/791,010

(22) Filed: Feb. 14, 2020

(65) Prior Publication Data

US 2021/0257476 A1 Aug. 19, 2021

(51) Int. Cl.
*H01L 29/423* (2006.01)
*H01L 29/778* (2006.01)
*H01L 29/417* (2006.01)
*H01L 29/40* (2006.01)

(52) U.S. Cl.
CPC ...... *H01L 29/42376* (2013.01); *H01L 29/402* (2013.01); *H01L 29/41775* (2013.01); *H01L 29/7786* (2013.01)

(58) Field of Classification Search
CPC . H01L 29/2003; H01L 29/402; H01L 29/404; H01L 29/66462; H01L 29/408; H01L 29/42376; H01L 29/41775
USPC .......... 257/76, 192, 194, 339, 367, E21.407, 257/E29.026, E29.04; 438/172, 197, 454
See application file for complete search history.

(56) References Cited

U.S. PATENT DOCUMENTS

| | | | | |
|---|---|---|---|---|
| 5,362,979 A * | 11/1994 | Merchant | .............. | H01L 29/861 257/340 |
| 6,492,678 B1 * | 12/2002 | Hebert | .................. | H01L 29/402 257/138 |
| 2007/0224710 A1 * | 9/2007 | Palacios | .............. | H01L 29/2003 257/E29.253 |
| 2007/0249119 A1 * | 10/2007 | Saito | ................... | H01L 29/2003 257/192 |
| 2008/0277692 A1 * | 11/2008 | Saito | ..................... | H01L 29/778 257/E29.253 |
| 2010/0084687 A1 * | 4/2010 | Chen | ................... | H01L 29/7788 257/E21.403 |
| 2010/0230717 A1 * | 9/2010 | Saito | ..................... | H01L 29/872 257/140 |
| 2010/0314666 A1 * | 12/2010 | Saito | ................... | H01L 29/0619 257/E29.091 |
| 2011/0074493 A1 * | 3/2011 | Denison | .............. | H01L 29/7834 327/536 |
| 2011/0212582 A1 * | 9/2011 | Hong | .................... | H01L 29/402 257/E21.403 |
| 2013/0009225 A1 * | 1/2013 | Kocon | ................ | H01L 29/7803 257/E27.06 |

(Continued)

*Primary Examiner* — David Chen
(74) *Attorney, Agent, or Firm* — Birch, Stewart, Kolasch & Birch, LLP

(57) ABSTRACT

A semiconductor structure includes a substrate, a gate structure on the substrate, and a source structure and a drain structure on opposite sides of the gate structure. The gate structure includes a gate electrode on the substrate and a gate metal layer on the gate electrode. The gate metal layer has at least one notch, which exposes the gate electrode below. The electric potential of the source structure is different from that of the gate structure.

16 Claims, 18 Drawing Sheets

(56) References Cited

U.S. PATENT DOCUMENTS

| | | | | |
|---|---|---|---|---|
| 2013/0146973 A1* | 6/2013 | Mitra | ............... | H01L 29/66719 257/335 |
| 2014/0361342 A1* | 12/2014 | Sriram | ................. | H01L 29/402 257/194 |
| 2015/0028390 A1* | 1/2015 | Colino | ............... | H01L 29/7786 257/194 |
| 2015/0076563 A1* | 3/2015 | Yu | ........................ | H01L 29/778 257/194 |
| 2016/0118489 A1* | 4/2016 | Hikita | ............... | H01L 29/7786 257/194 |
| 2016/0190297 A1* | 6/2016 | Kudymov | ............ | H01L 29/404 257/76 |
| 2016/0225886 A1* | 8/2016 | Saito | .................. | H01L 29/7786 |
| 2018/0076311 A1* | 3/2018 | Saito | .................... | H01L 29/402 |
| 2019/0123151 A1* | 4/2019 | Li | ............................ | H01L 29/78 |
| 2019/0288066 A1* | 9/2019 | Lee | ................... | H01L 21/26586 |
| 2021/0013334 A1* | 1/2021 | Huang | ............... | H01L 29/7786 |
| 2021/0066483 A1* | 3/2021 | Lin | .................... | H01L 29/2003 |
| 2021/0167202 A1* | 6/2021 | Lu | ...................... | H01L 29/0642 |

* cited by examiner

SEMICONDUCTOR STRUCTURE WITH GATE METAL LAYER

BACKGROUND

Technical Field

The disclosure relates to a semiconductor structure, and more particularly to a semiconductor structure having gate field plates.

Description of the Related Art

Gallium nitride-based (GaN-based) semiconductor materials have many excellent characteristics, such as high thermal resistance, a wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

With the developments of GaN-based semiconductor materials, those semiconductor devices which use GaN-based semiconductor materials are applied in the more critical working environments, such as those with higher frequencies, higher temperatures or higher pressure. Therefore, the conditions of the process of fabricating semiconductor devices with GaN-based semiconductor materials still need further improvements to overcome various new challenges.

SUMMARY

In one embodiment of the present disclosure, a semiconductor structure is provided, wherein the semiconductor structure includes a substrate, a gate structure on the substrate, a source structure and a drain structure on opposite sides of the gate structure. The gate structure includes a gate electrode on the substrate and a gate metal layer on the gate electrode. The gate metal layer has at least one notch, which exposes the gate electrode below. The electric potential of the source structure is different from that of the gate structure.

In one embodiment of the present disclosure, a semiconductor structure is provided, wherein the semiconductor structure includes a substrate, a gate structure on the substrate, a source structure and a drain structure on opposite sides of the gate structure. The gate structure includes a gate electrode on the substrate and a gate metal layer on the gate electrode. From a top view projecting the gate electrode and the gate metal layer to the substrate, the gate metal layer comprises a U shape and partially overlaps the gate electrode.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1:
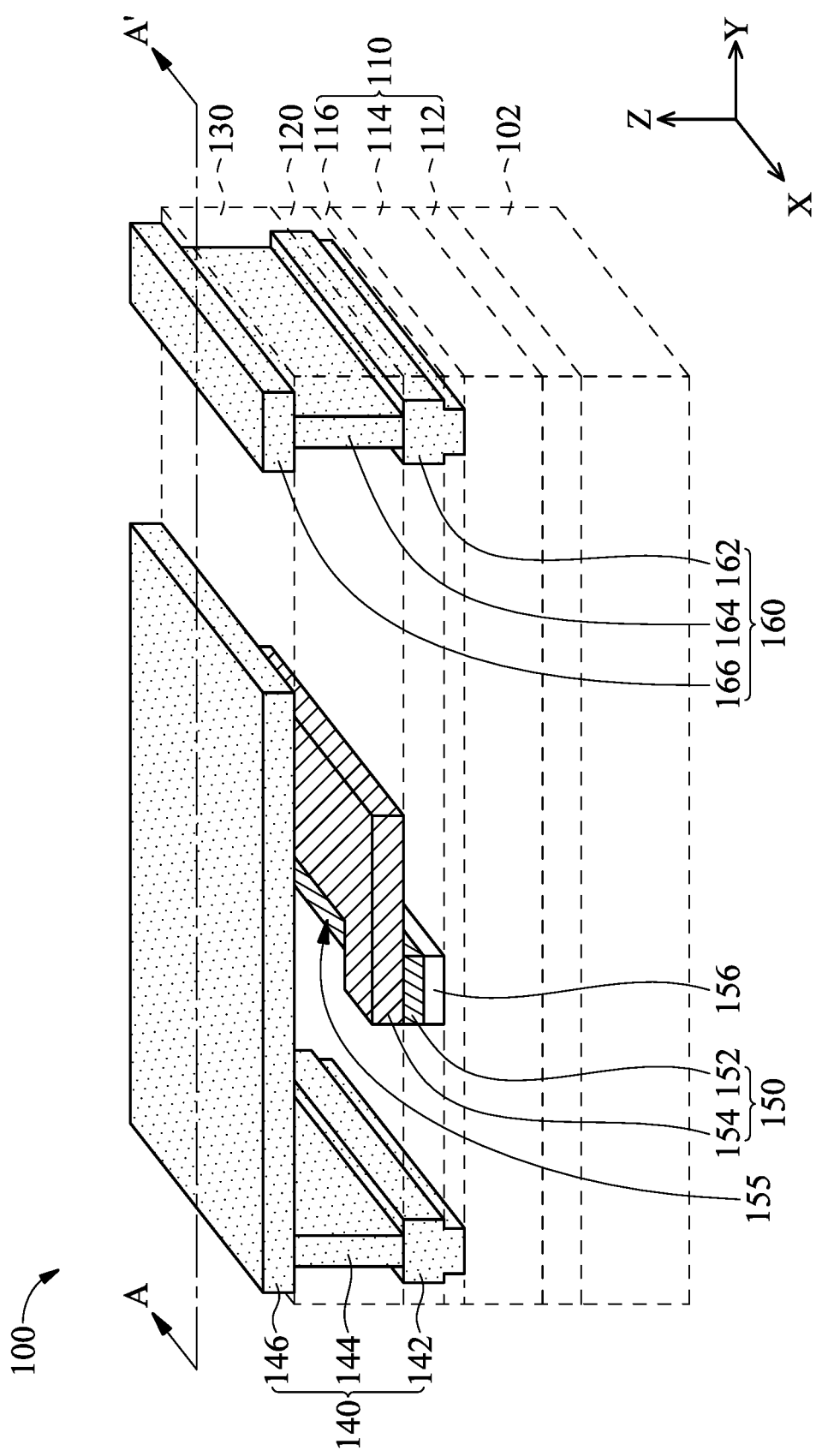
FIG. 1 is a partial perspective view illustrating an exemplary semiconductor structure according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

The semiconductor structure provided by embodiments of the present disclosure may reduce a risk of a gate structure suffering from high electric fields by extending a gate metal layer, which acts as a gate field plate, toward a direction of a drain structure. In addition, the semiconductor structure provided by embodiments of the present disclosure may also effectively reduce the gate-to-drain capacitance ($C_{gd}$) and the gate-to-source capacitance ($C_{gs}$) and therefore reduce switch losses and malfunctions when switching fast. Therefore, the semiconductor structure provided by embodiments of the present disclosure not only reduce input capacitance ($C_{gd}+C_{gs}$), but also effectively reduce switching loss, thereby improving the performance of the semiconductor structure.

FIG. 1 is a partial perspective view illustrating an exemplary semiconductor structure according to some embodiments of the present disclosure. As shown in FIG. 1, the semiconductor structure 100 includes a compound semiconductor layer 110 on a substrate 102, dielectric layers 120 and 130 on the compound semiconductor layer 110. The semiconductor structure 100 further includes a gate structure 150 on the compound semiconductor layer 110, and a source structure 140 and a drain structure 160 on opposite sides of the gate structure 150.

In some embodiments, the substrate 102 may be a doped (such as doped with a p-type or an n-type dopant) or an undoped semiconductor substrate, such as a silicon substrate, a silicon germanium substrate, a gallium arsenide substrate, or the like. In some embodiments, the substrate 102 may be a substrate including a semiconductor on an insulator, such as a silicon on insulator (SOI) substrate. In other embodiments, the substrate 102 may be a ceramic substrate, such as an aluminium nitride (AlN) substrate, a silicon carbide (SiC) substrate, an aluminium oxide ($Al_2O_3$) (or so-called sapphire substrate), or the like.

In some embodiments, the compound semiconductor layer 110 includes a buffer layer 112, a channel layer 114 on the buffer layer 112, and a barrier layer 116 on the channel layer 114. The buffer layer 112 may be helpful to mitigate a strain of the channel layer 114 which is subsequently formed over the buffer layer 112, and to prevent defects formed in the overlying channel layer 114. The strain is caused by a mismatch between the channel layer 114 and the substrate 102. In some embodiments, the material of the buffer layer 112 may be AlN, GaN, $Al_xGa_{1-x}N$ (wherein 0<x<1), a combination thereof, or the like. The buffer layer 112 may be formed by an epitaxial growth process, such as metal organic chemical vapor deposition (MOCVD), hydride vapor phase epitaxy (HVPE), molecular beam epitaxy (MBE), a combination thereof, or the like. It should be noted that although the buffer layer 112 is illustrated as a single layer structure in the embodiment as shown in FIG. 1, the buffer layer 112 may also be a multilayered structure in other embodiments (not shown).

In some embodiments, two-dimensional electron gas (2DEG) (not shown) is formed at a heterogeneous interface between the channel layer 114 and the barrier layer 116. The semiconductor structure 100 as shown in FIG. 1 is a high electron mobility transistor (HEMT) which utilizes 2DEG as conductive carriers. In some embodiments, the channel layer 114 may be a GaN layer, and the barrier layer 116 formed on the channel layer 114 may be an AlGaN layer, wherein the GaN layer and the AlGaN layer may be doped, such as with an n-type or a p-type dopant, or may have no dopant therein. The channel layer 114 and the barrier layer 116 may be formed by an epitaxial growth processes, such as MOCVD, HVPE, MBE, a combination thereof, or the like.

Still referring to FIG. 1, subsequently, the dielectric layers 120 and 130, the gate structure 150, and the source structure 140 and the drain structure 160 on opposite sides of the gate structure 150 are formed on the compound semiconductor layer 110 by deposition processes and patterning processes.

In some embodiments, the gate structure 150 includes a gate electrode 152 and a gate metal layer 154 electrically connected to the gate electrode 152. In some embodiments, the gate electrode 152 is disposed on the barrier layer 116 and embedded in the dielectric layer 120, and the gate metal layer 154 is disposed on the dielectric layer 120 and covered by the dielectric layer 130. In other embodiments, an optional doped compound semiconductor layer 156 may be disposed between the gate electrode 152 and the barrier layer 116. Further details are described below.

In some embodiments, the source structure 140 includes a source electrode 142, a source contact 144, and a source metal layer 146. In some embodiments, the source electrode 142 is embedded in the dielectric layer 120, and the source metal layer 146 is disposed on the dielectric layer 130, wherein the source electrode 142 is electrically connected to the source metal layer 146 by the source contact 144 which is buried in the dielectric layer 130. The electric potential of the source metal layer 146 electrically connected to the source electrode 142 is different from the electric potential of the gate metal layer 154 electrically connected to the gate electrode 152. In such an embodiment, the source metal layer 146, which acts as a source field plate, is extended toward a direction of a drain structure 160 to reduce electric field intensity.

In some embodiments, the drain structure 160 includes a drain electrode 162, a drain contact 164, and a drain metal layer 166. In some embodiments, the drain electrode 162 is embedded in the dielectric layer 120, and the drain metal layer 166 is disposed on the dielectric layer 130, wherein the drain metal layer 166 is electrically connected to the drain electrode 162 by the drain contact 164 which is embedded in the dielectric layer 130. In some embodiments, the source electrode 142 and the drain electrode 162 disposed on opposite sides of the gate electrode 152 both penetrate through the barrier layer 116 and contact the channel layer 114.

In some embodiments, the material of the gate electrode 152 may be conductive materials, such as metal, metal nitride, or semiconductor materials. In some embodiments, the metal materials may be Au, Ni, Pt, Pd, Ir, Ti, Cr, W, Al, Cu, the like, a combination thereof, or multilayers thereof. The semiconductor materials may be polycrystalline silicon or polycrystalline germanium. The conductive material may be formed on the barrier layer 116 by chemical vapor deposition (CVD), sputtering, resistive thermal evaporation process, electron beam evaporation process, or other suitable deposition processes, and a patterning process is performed on the conductive material to form the gate electrode 152.

In some embodiments, before the formation of the gate electrode 152, the doped compound semiconductor layer 156 may be formed on the barrier layer 116, and the gate electrode 152 is formed on the doped compound semiconductor layer 156 subsequently. The generation of 2DEG under the gate electrode 152 can be inhibited by the doped compound semiconductor layer 156 disposed between the gate electrode 152 and the barrier layer 116 so as to attain a normally-off status of the semiconductor structure 100. In some embodiments, the material of the doped compound semiconductor layer 156 may be GaN which is doped with a p-type dopant or an n-type dopant. The steps for forming the doped compound semiconductor layer 156 may include an epitaxial growth process and an etch back process to form the doped compound semiconductor layer 156 at the predetermined position which is corresponding to where the gate electrode 152 is to be formed.

In some embodiments, the materials of the source electrode 142 and the drain electrode 162 which are formed on opposite sides of the gate electrode 152 may be selected from the materials for forming the gate electrode 152. Furthermore, the source electrode 142 and the drain electrode 162 formed on opposite sides of the gate electrode 152 may be formed simultaneously and in the same process as the gate electrode 152. The details are not described again herein to avoid repetition. In other embodiments, the gate electrode 152 may be formed in a different processes than the source electrode 142 and the drain electrode 162 on opposite sides of the gate electrode 152.

In some embodiments, the gate metal layer 154, the source contact 144, the source metal layer 146, the drain contact 164, and the drain metal layer 166 may be formed by deposition processes and patterning processes. The material of the gate metal layer 154, the source contact 144, the source metal layer 146, the drain contact 164, and the drain metal layer 166 may include conductive materials, such as aluminium (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicide nitride (TaSiN), tantalum carbide nitride (TaCN), titanium aluminide (TiAl), titanium aluminide nitride (TiAlN), metal oxides, metal alloys, other suitable conductive materials, or a combination thereof.

In some embodiments, the dielectric layers 120 and 130 may respectively include single layer or multi-layers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but not limited thereto. For example, a deposition process, such as spin coating, chemical vapor deposition (CVD), physical vapor deposition (PVD), atomic layer deposition (ALD), high density plasma CVD (HDPCVD), other suitable methods, or a combination thereof, may be used to form the dielectric layers 120 and 130.

Still referring to FIG. 1, the semiconductor structure 100 has a length direction X, a width direction Y, a height direction Z. In this embodiment, the −Y direction is defined by a direction facing toward the source structure and the +Y direction is defined by a direction facing toward the drain structure.

Still referring to FIG. 1, gate metal layer 154 has a notch 155, which exposes the gate electrode 152 below so as to improve switching speed according to some embodiments of the present disclosure. That is, a notch 155 is formed by recessing the gate metal layer 154. In other words, the dielectric layer 130 penetrates through the notch of the gate metal layer 154 and directly contacts the gate electrode 152. On the contrary, in the comparative embodiments where the gate metal layer has no notch, the dielectric layer covering gate metal layer would not penetrate through the gate metal layer and contact gate electrode In some embodiments, from top view, the notch 155 may face toward the direction of the source structure (in the −Y direction) to reduce the gate-to-source capacitance ($C_{gs}$) and the gate-to-drain capacitance ($C_{gd}$) at the same time.

In the comparative embodiments of the high electron mobility transistors (HEMT), field plates are typically disposed in the high electric field region of the semiconductor device in order to reduce the peak electric field of the high electric field region. A type of field plate is a field plate that is in connection with the source electrode (i.e., source field plate). Another type of field plate is one that is in connection with the gate electrode (i.e., gate field plate). Both of them can reduce the electric field intensity at the side of the gate near the drain. However, the configuration of the field plate dramatically increases the gate-to-drain capacitance ($C_{gd}$) and the gate-to-source capacitance ($C_{gs}$) and thus causes serious switching loss.

Therefore, in some embodiments of the present disclosure, the gate metal layer 154 is provided with at least one notch 155 to reduce the coverage of the source field plate to the gate field plate, thereby reducing the gate-to-source capacitance ($C_{gs}$) and also reduce the coverage of the gate field plate to the two-dimensional electron gas (2DEG)(not shown) formed between the channel layer 114 and the barrier layer 116, thereby reducing the gate-to-drain capacitance ($C_{gd}$) by the gate metal layer 154 with at least one notch 155. When the input capacitances ($C_{gs}+C_{gd}$) is reduced, the switching speed is increased, and the switching loss is also reduced. It should be noted that the coverage of the sources metal layer 146 to the gate metal layer 154 provided by the embodiments of the present disclosure is merely exemplary and may be adjusted depending on the product design and the required switching speed.

Figure 2:
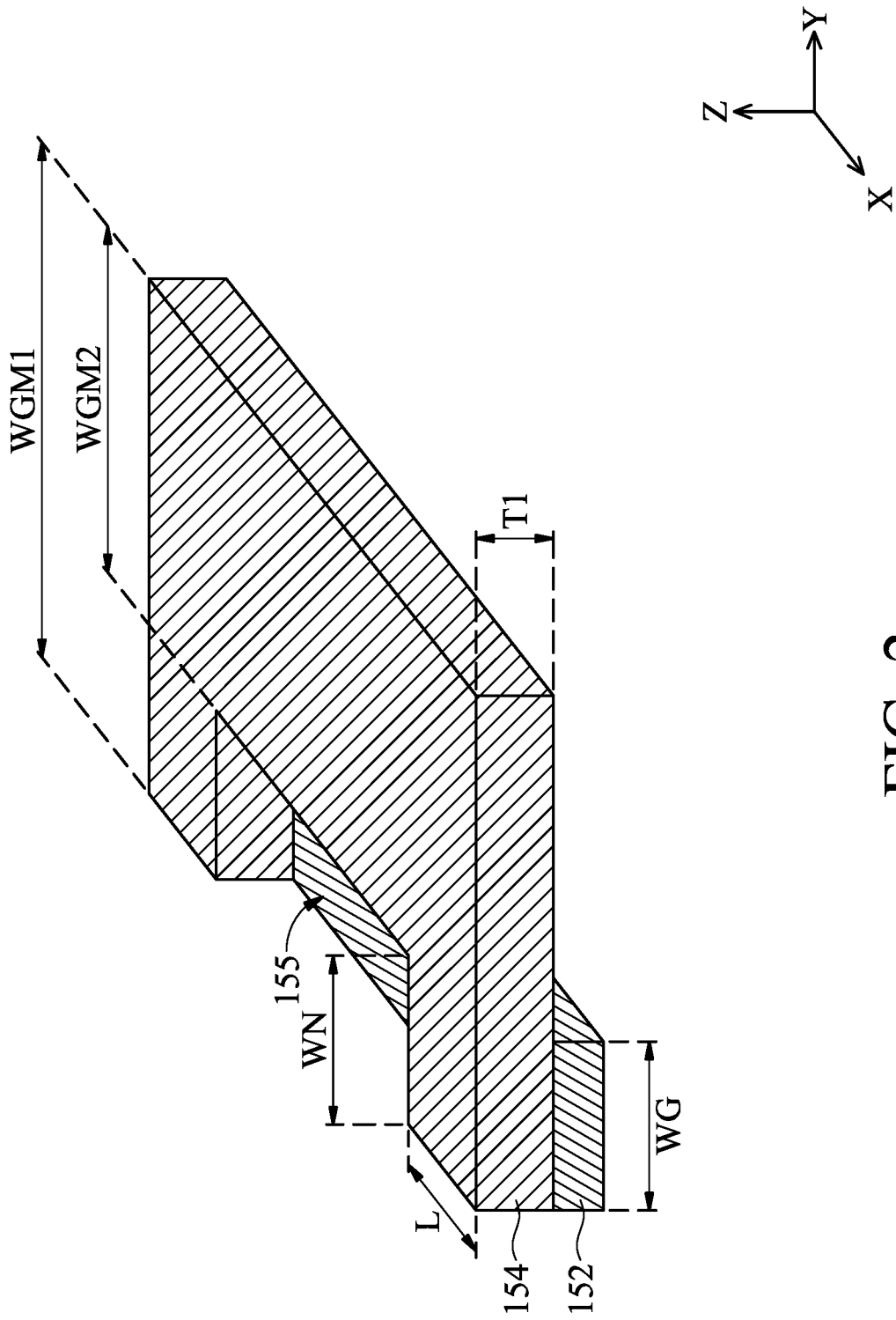
FIG. 2 is a perspective view illustrating an exemplary partial semiconductor structure according to some embodiments of the present disclosure.

Now referring to FIG. 2. FIG. 2 is a perspective view illustrating an exemplary partial semiconductor structure according to some embodiments of the present disclosure. It should be noted that FIG. 2 is a perspective view merely to illustrate the gate electrode 152 and the gate metal layer 154 and also adopting the X, Y, Z directions shown in FIG. 1 so as to depict the relative positions. The gate metal layer 154 has a thickness T1 (in the Z direction), a maximum width WGM1, a minimum width WGM2 (in the Y direction) and a length L on the opposite sides of the notch 155 (in the X direction). The gate electrode 152 has a width WG (in the Y direction).

In an embodiment, the minimum width WGM2 of the gate metal layer 154 is greater than or equal to the difference of the maximum width WGM1 of the gate metal layer 154 and the width WG of the gate electrode 152. In other words, the width WN of the notch 155 is less than or equal to the width WG of the gate electrode 152. For example, when the width WG of the gate electrode is about the width WN of the notch 155 may be about 1 μm, about 0.5 μm or about 0.2 μm. When the width WN of the notch is greater than the width WG of the gate electrode, breakdown voltage may reduce easily.

In an embodiment, the length L of the gate metal layer 154 on opposite sides of the notch 155 is greater than or equal to five times of the thickness T1 of the gate metal layer 154. For example, when the thickness T1 of the gate electrode 152 is about 0.2 μm, the length L of the gate metal layer 154 may be about 1 μm, about 1.5 μm, or about 2 μm. When the length L of the gate metal layer 154 on opposite sides of the notch 155 is less than five times of the thickness of the gate metal layer 154, device may breakdown easily.

It should be noted that in order to succinctly describe the embodiments of the present disclosure and highlight the technical features thereof, not all the elements of the semiconductor structure 100 in FIG. 1 are illustrated in FIG. 2.

Figure 3:
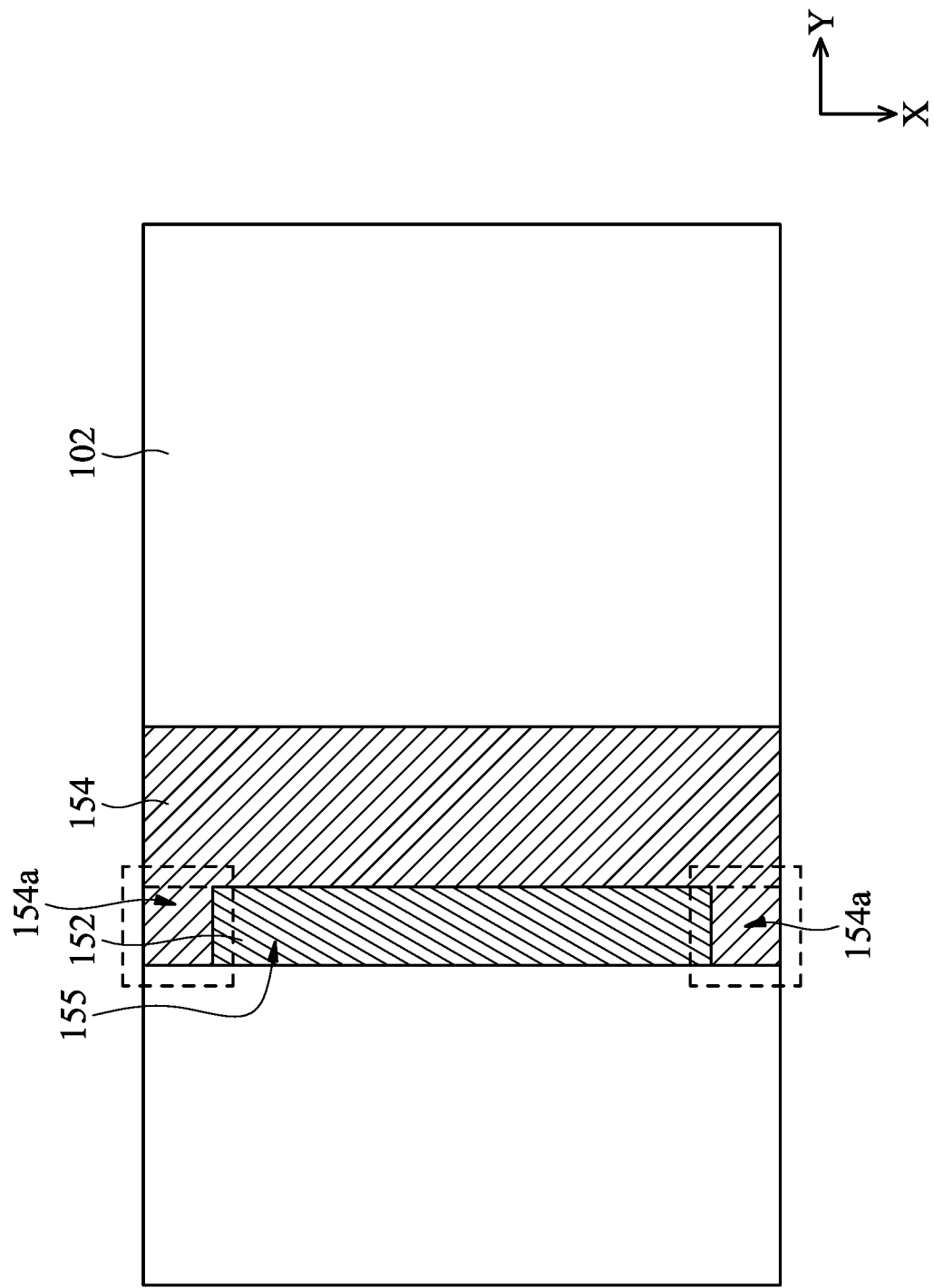
FIG. 3 is a top view of projection of a part of the semiconductor structures corresponding to FIG. 1 according to some embodiments of the present disclosure.

FIG. 3 is a top view of projection of a part of the semiconductor structure corresponding to FIG. 1 according to some embodiments of the present disclosure. FIG. 3 also uses the coordinates shown in FIG. 1. However, FIG. 3 is a plan view and thus only has an X direction and a Y direction. From a top view projecting the gate electrode 152 and the gate metal layer 154 to the substrate 102, the gate metal layer 154 may be a U shape and may partially overlap the gate electrode 152, as shown in FIG. 3. The overlap area of the gate metal layer 154 and the gate electrode 152 may take up about 10%, about 30%, about 50%, or about 70% of the area of the gate electrode 152 in order to reduce the electric field intensity and the input capacitance ($C_{gs}+C_{gd}$) at the same time.

Still referring to FIG. 3. In some embodiment, the notch 155 exposes a side of the gate electrode 152 and aligns with the other side of the gate electrode 152. In other words, in such a case, the width WN of the notch is the same as the width WG of the gate electrode. Also, the notch faces toward −Y direction. In some embodiments, the shape of the gate metal layer 154 on opposite sides of the notch 155 may be the same. In other words, in this case, with respect to a central line in a length direction (in the X direction), the gate metal layer 154 is symmetrical. In some embodiments, a portion of the gate metal layer 154a on opposite sides of the notch 155 may have a contour of a rectangle. That is, the notch 155 may be a rectangle. In the embodiment shown in FIG. 3, the width WN of the notch may be adjusted depending on the product design and the required switching speed so the area of the gate electrode exposed by the notch may be different.

Figure 4:
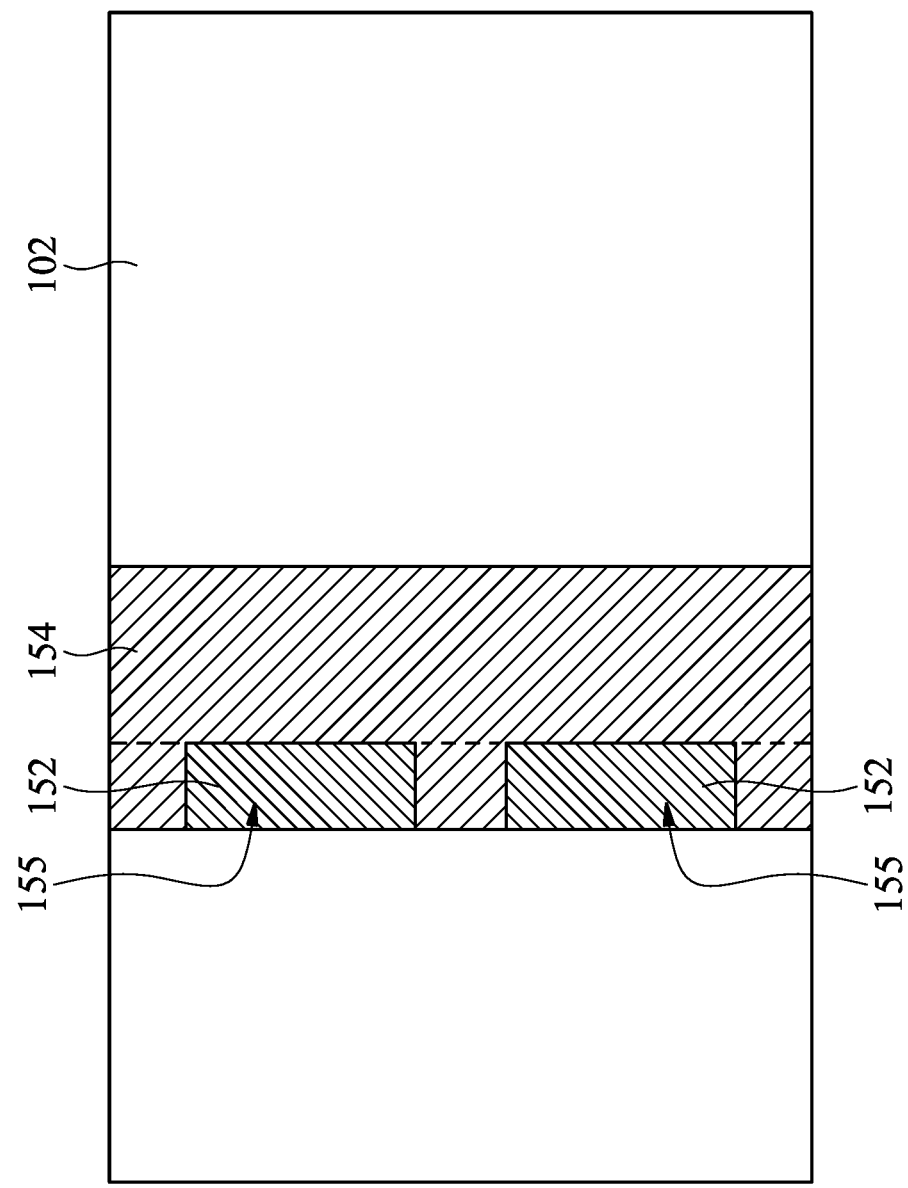
FIGS. 4-11 are top views of projections of a part of the semiconductor structures according to some embodiments of the present disclosure.
Figure 5:
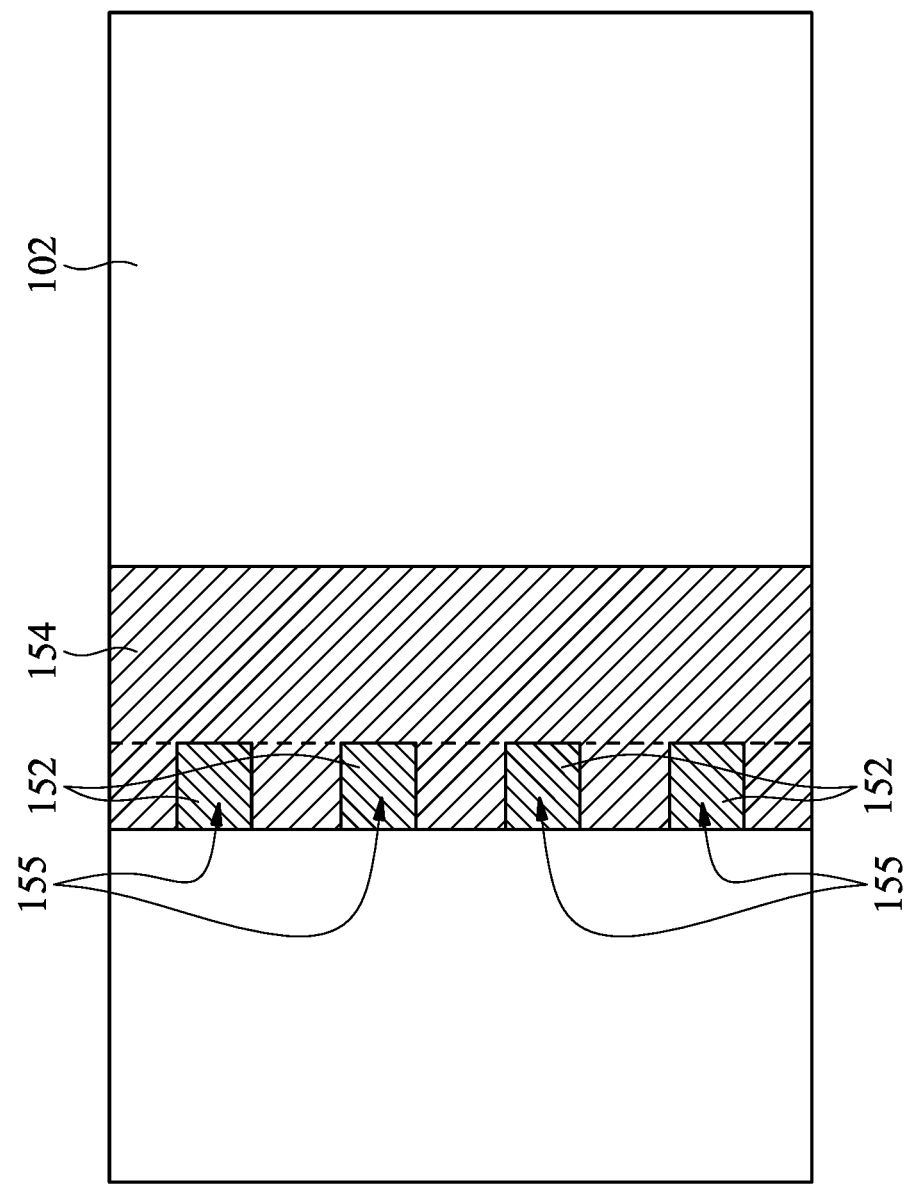

FIGS. 4-11 are top views of projections of a part of the semiconductor structures according to some embodiments of the present disclosure. FIGS. 4-11 also use the coordinates shown in FIG. 1 and thus have an X direction and a Y direction (not shown). From a top view projecting the gate electrode 152 and the gate metal layer 154 to the substrate 102, the gate metal layer may have two notches 155 as shown in FIG. 4 or four notches as shown in FIG. 5. The gate metal layer 154 may also be a comb shape as shown in FIG. 5. It should be noted that although limited a number of the notches are illustrated in FIGS. 4 and 5, they may be adjusted depending on required, and the disclosure is not limited thereto.

Figure 6:
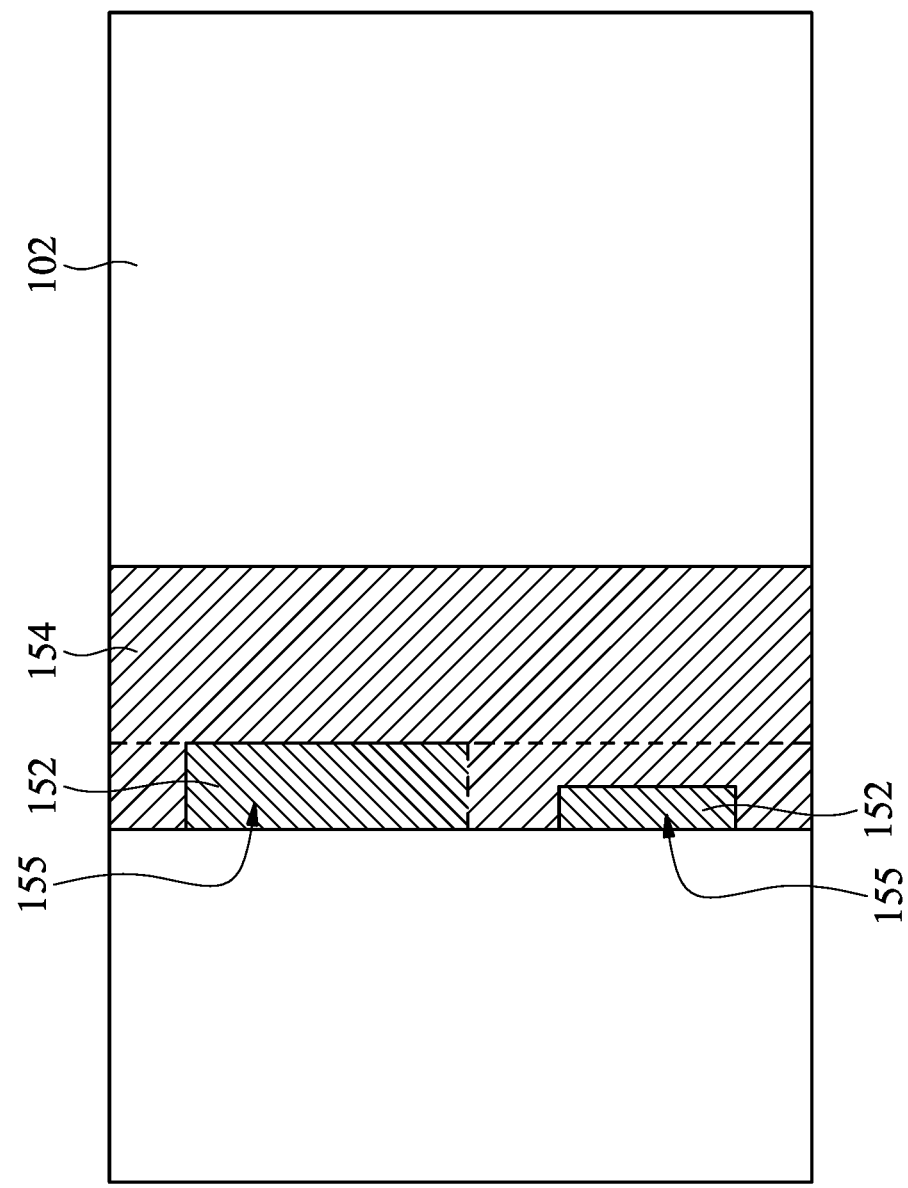

In some embodiments, multiple notches 155 of the gate metal layer 154 may have the same shape and size as each other as shown in FIG. 4. Alternatively, they may have different shape and size from each other as shown in FIG. 6. In other words, the size of the notch may be adjusted depending on the requirement in order to adjust switching speed. Specifically, as the size of the notch in the width direction is larger, the switching speed is faster due to the reduction of the input capacitance.

Figure 7:
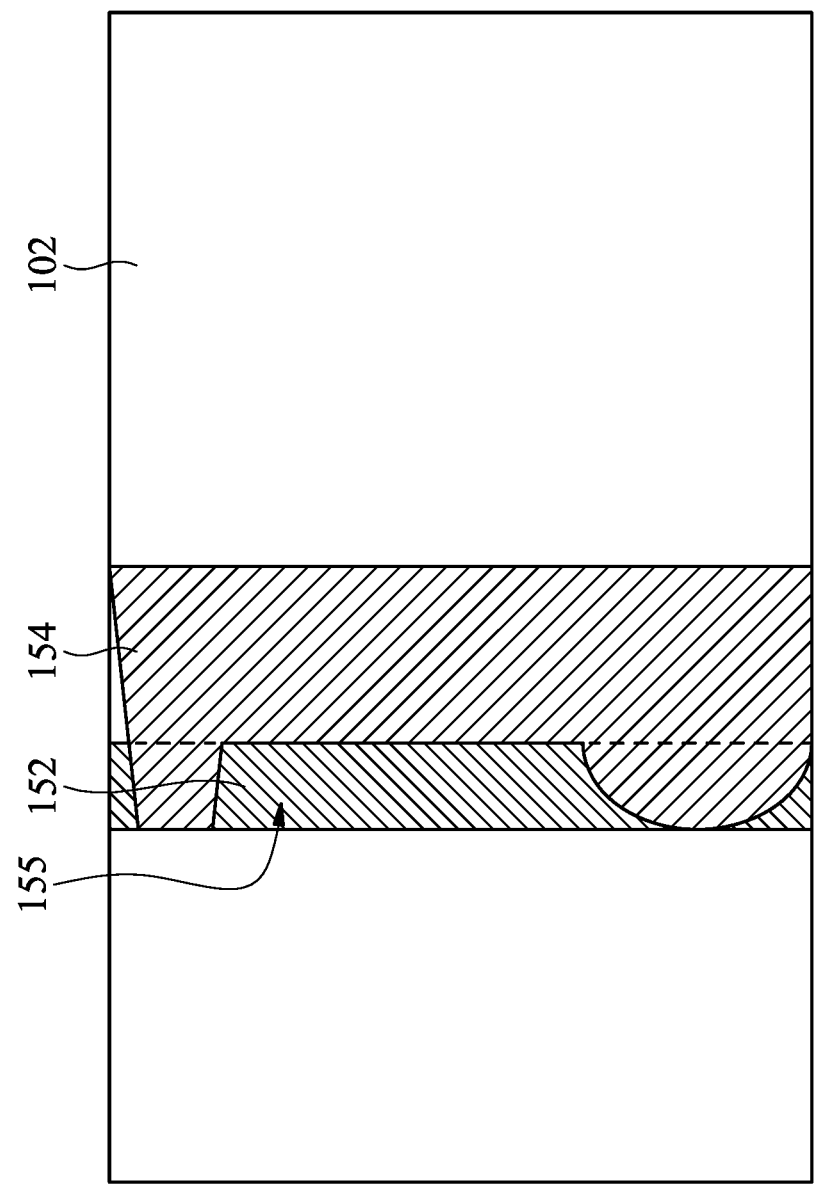
Figure 8:
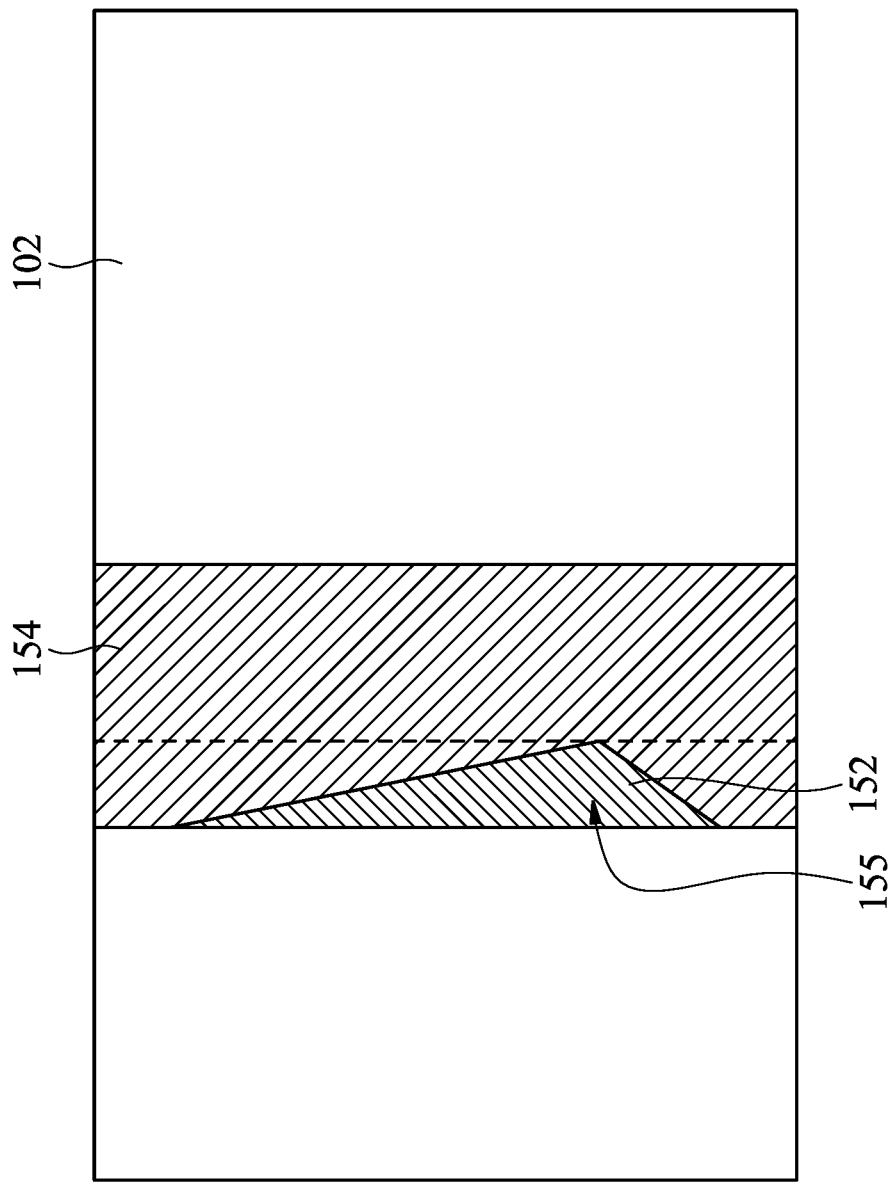
Figure 9:
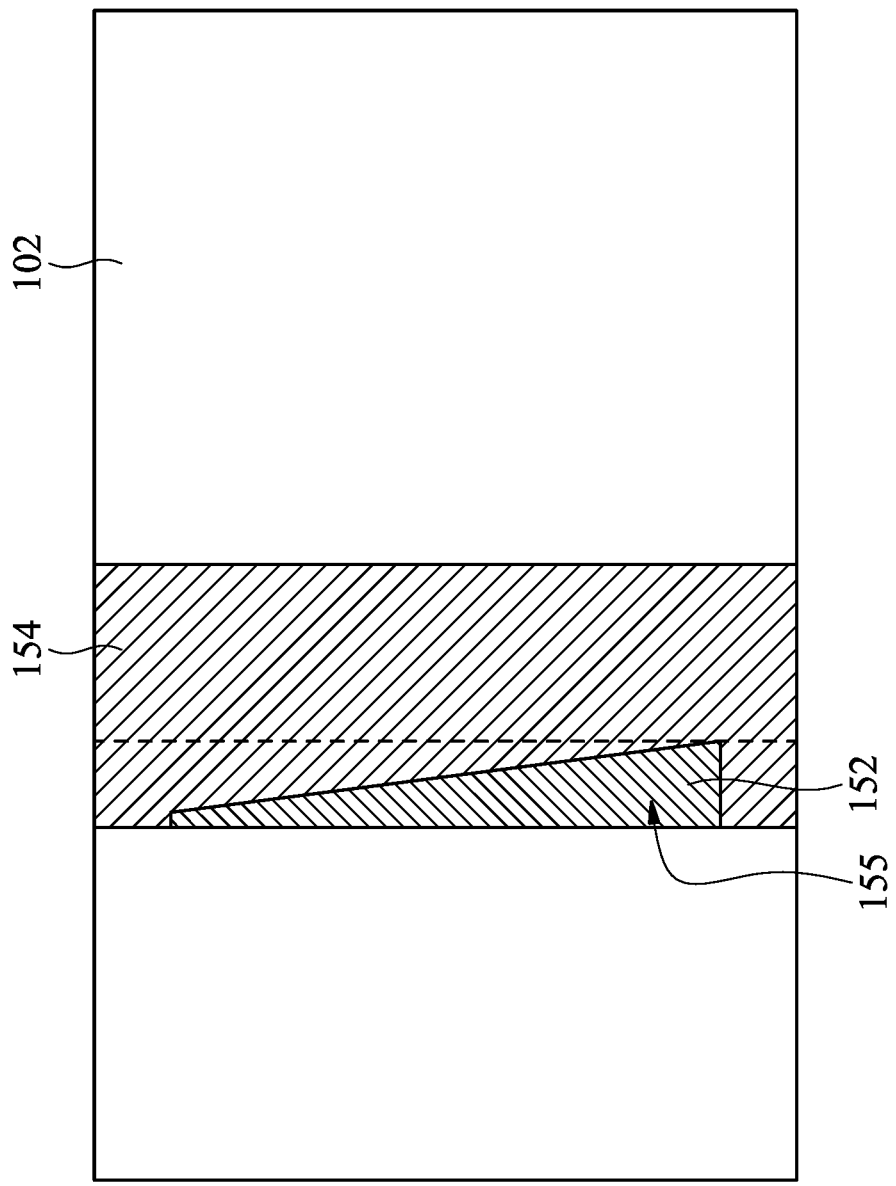

In some embodiments, the gate metal layer 154 on opposite sides of the notch 155 and on the gate electrode 152 may have a contour of an arc or a trapezoid as shown in FIG. 7. In some embodiments, the notch 155 may be a triangle as shown in FIG. 8. In some embodiments, the notch 155 may be a trapezoid as shown in FIG. 9. The area and the shape of the gate electrode exposed by the notch affect the area and the shape of the gate metal layer on opposite sides of the notch, and thus the notch may be adjusted depending on the product design and the required switching speed.

In some embodiments, the notch 155 may vary linearly along an extension of the gate electrode. In other words, the width of the gate metal layer may vary linearly along an extension of the gate electrode as shown in FIG. 9. In such a case, in different electron flow directions in the semiconductor structure, the width of the gate metal layer is different. In other words, when reducing $C_{gd}$, the excessive rise in the gate resistance is inhibited, thereby increasing the switching speed of the element.

Figure 10:
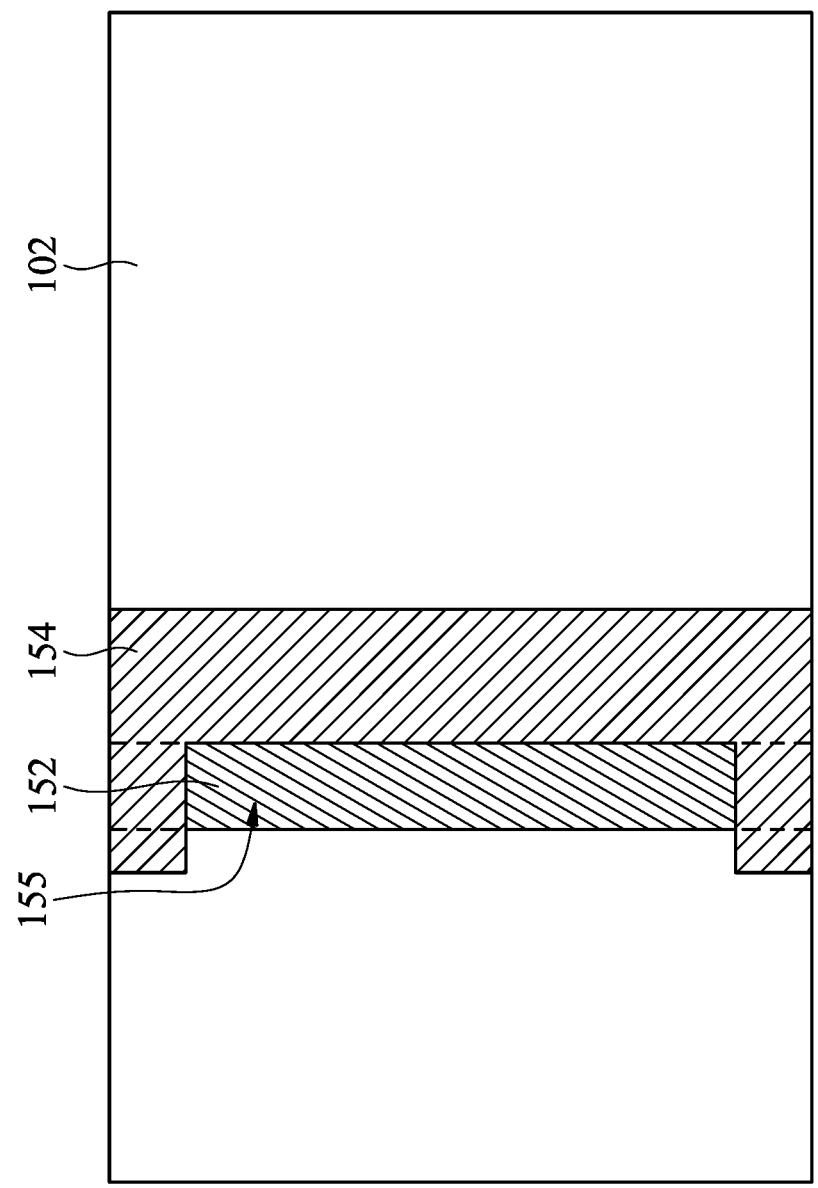

In some embodiments, the portion of the gate metal layer on opposite sides of the notch 155 extends beyond the gate electrode 152 as shown in FIG. 10. The area of the gate metal layer on opposite sides of the notch, which extends beyond the gate electrode, may be the same as the area of the gate metal layer overlapping the gate electrode. The area of the gate metal layer extending beyond the gate electrode may be adjusted in order to achieve the required switching speed.

Figure 11:
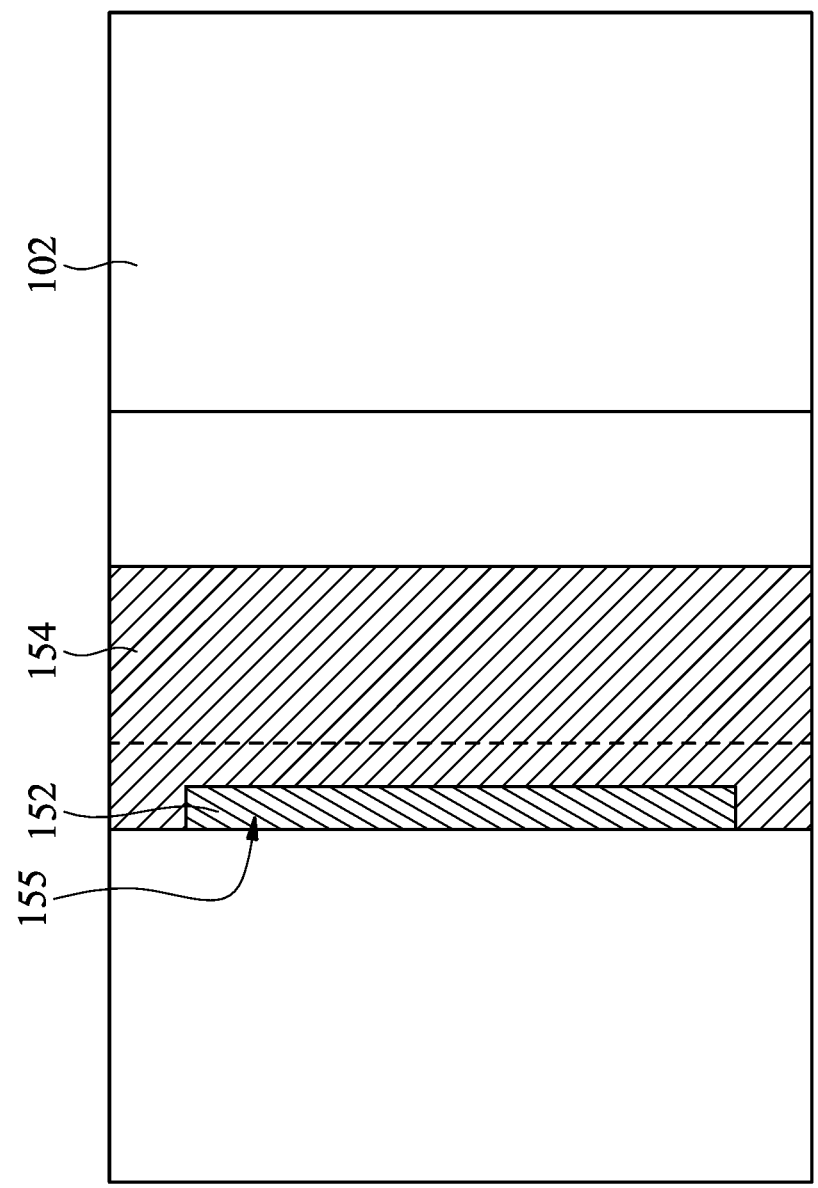

In some embodiments, the notch 155 exposes a side of the gate electrode 152 and covers the other side of the gate electrode 152. In other words, the width of the notch 155 is less than the width of the gate electrode 152 as shown in FIG. 11. In such a case, while reducing $C_{gd}$, the excessive rise in the gate resistance is inhibited, thereby increasing the switching speed of the device.

It should be noted that in order to succinctly describe the embodiments of the present disclosure and highlight the technical features thereof, not all the elements of the semiconductor structure 100 in FIG. 1 are illustrated in FIG. 3-11.

Figure 12:
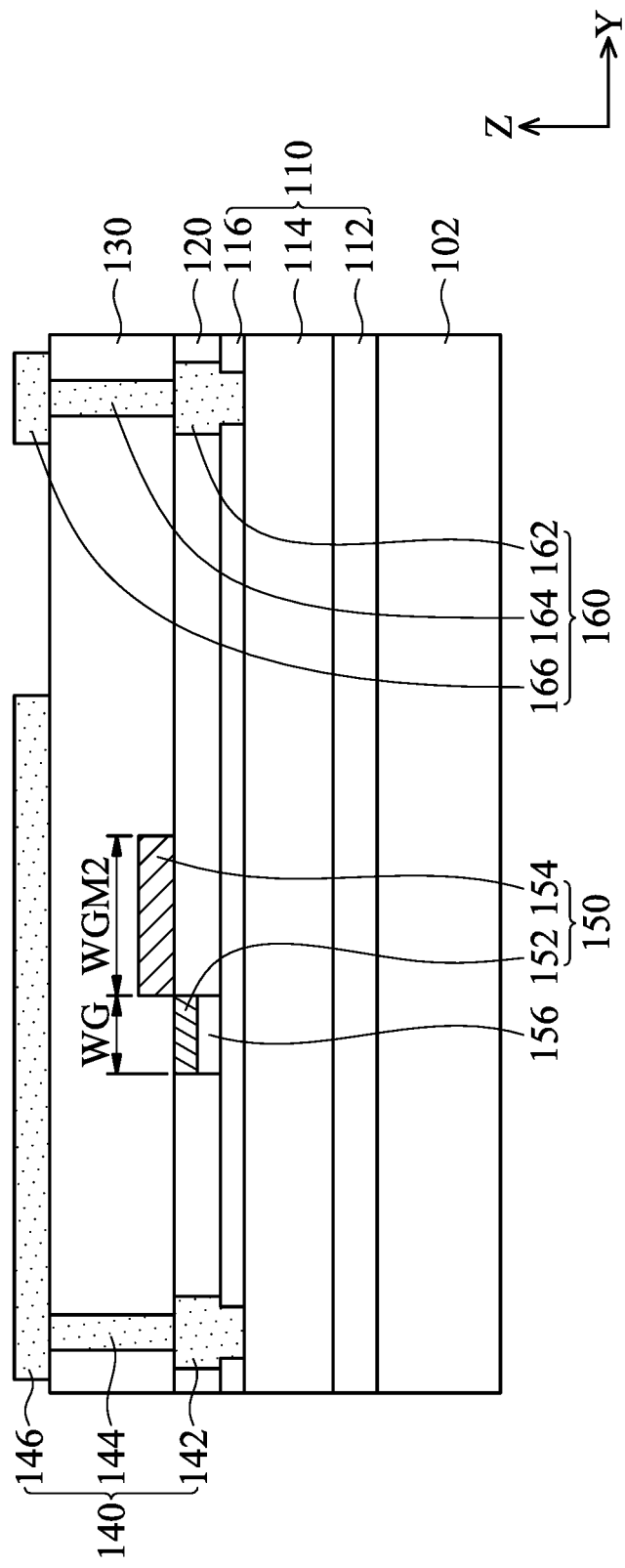
FIG. 12 is a cross-sectional view illustrating a semiconductor structure along line A-A' shown in FIG. 1 according to some embodiments of the present disclosure.

FIG. 12 is a cross-sectional view illustrating a semiconductor structure along line A-A' shown in FIG. 1 according to some embodiments of the present disclosure. FIG. 12 also uses the coordinates shown in FIG. 1. However, FIG. 12 is a plan view and thus only has a Y direction and a Z direction. In the embodiments shown in FIG. 12, the source metal layer 146 extends toward the drain structure 160 (+Y direction), and the source metal layer 146 extends beyond the gate metal layer 154 in order to optimize the electric field distribution and reduce the electric field intensity at the side of the gate near the drain.

Figure 13:
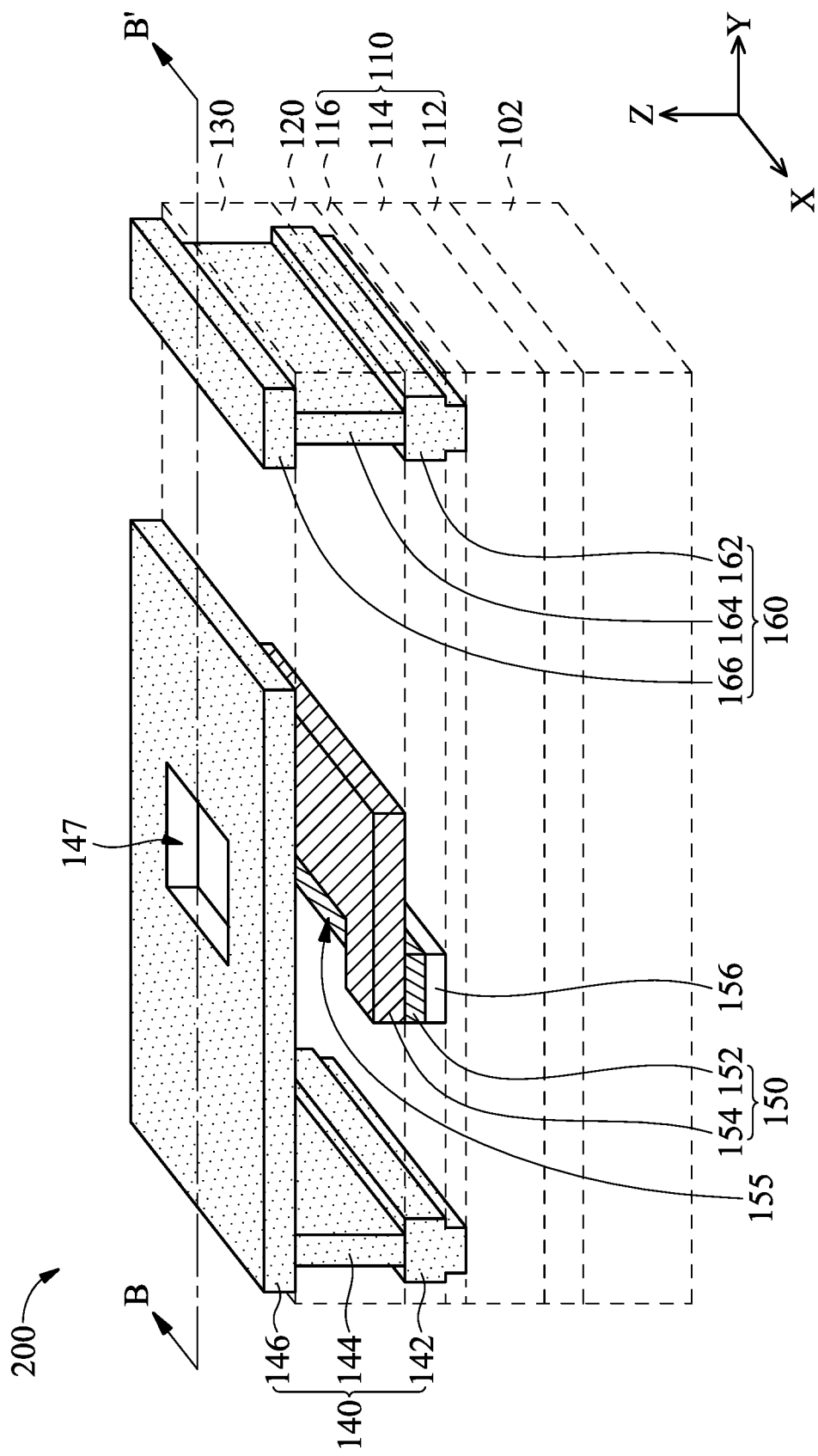
FIG. 13 is a partial perspective view illustrating an exemplary semiconductor structure according to other embodiments of the present disclosure.
Figure 14:
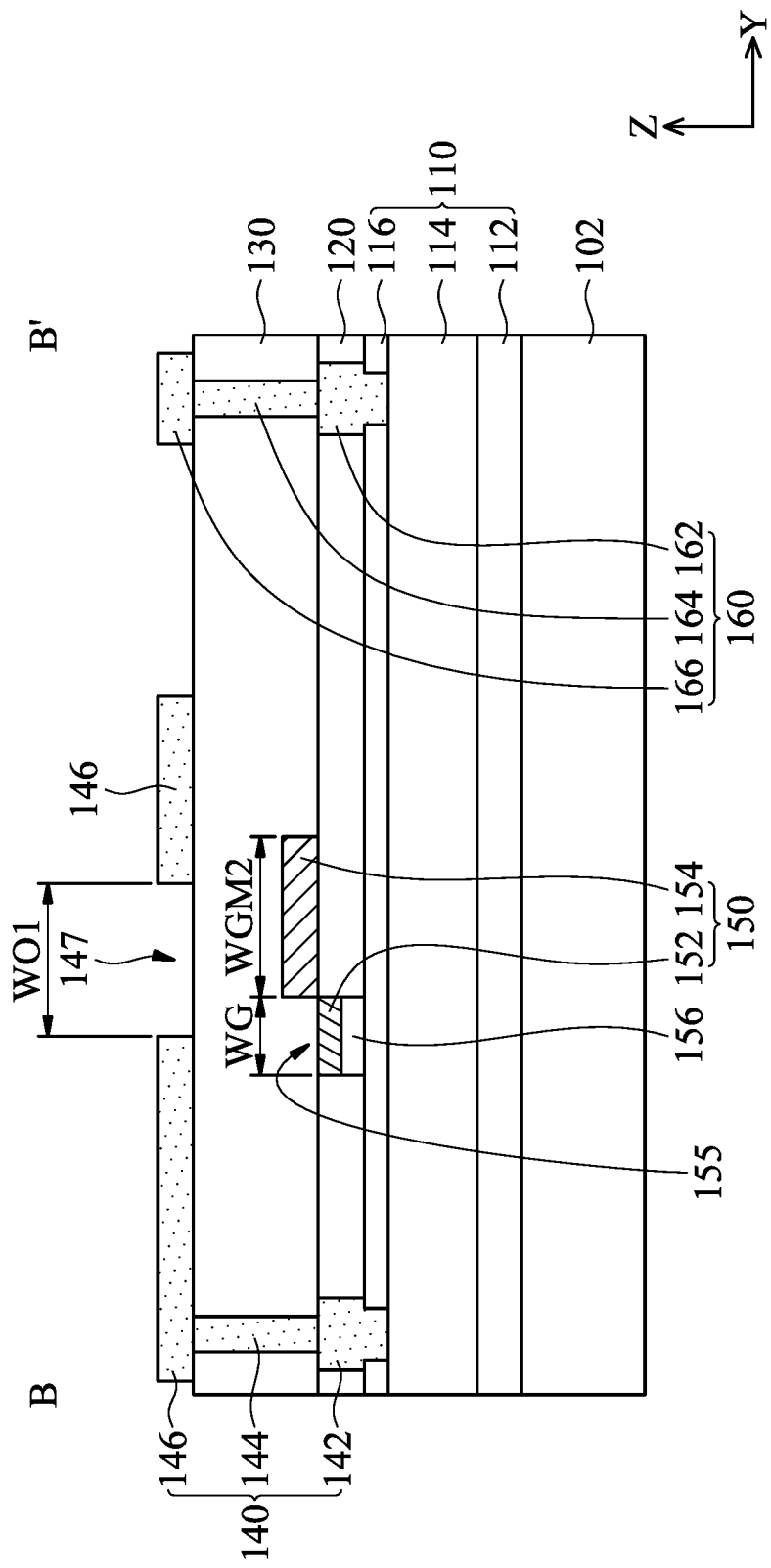
FIG. 14 is a cross-sectional view illustrating a semiconductor structure along line B-B' shown in FIG. 13 according to other embodiments of the present disclosure.
Figure 15:
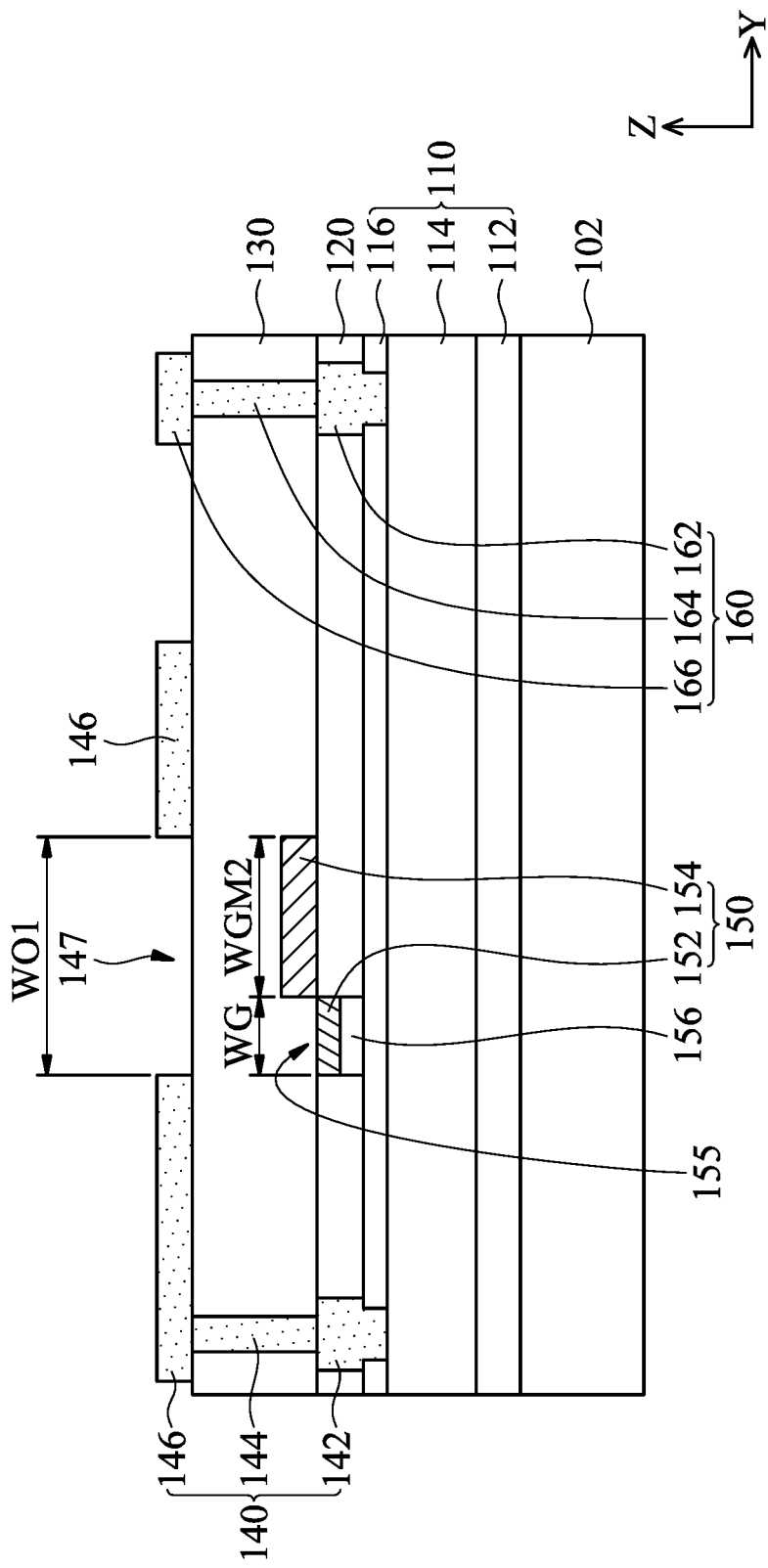
FIG. 15 is a cross-sectional view illustrating a semiconductor structure according to other embodiments of the present disclosure.

Referring to FIG. 13 along with FIGS. 14-15, FIG. 13 is a partial perspective view illustrating an exemplary semiconductor structure according to other embodiments of the present disclosure, and FIG. 14 is a cross-sectional view illustrating a semiconductor structure along line B-B' shown in FIG. 13 according to other embodiments of the present disclosure. In addition, FIG. 15 is a cross-sectional view illustrating a semiconductor structure according to other embodiments of the present disclosure.

FIG. 13 also uses the coordinates shown in FIG. 1 and has an X direction, a Y direction, and a Z direction. FIGS. 14-15 use the coordinates shown in FIG. 12 and have a Y direction and a Z direction in order to depict relative positions.

The semiconductor structure 200 illustrated in FIG. 13 is substantially similar to the semiconductor structure 100 illustrated in FIG. 1, and the difference is that the source metal layer 146 in the semiconductor structure 200 illustrated in FIG. 12 has an opening 147 in order to further reduce the gate-to-source capacitance ($C_{gs}$). In the cross-sectional views shown in FIGS. 14-15, the opening 147 of the source metal layer 146 has a width WO1, the gate electrode 152 has a width WG, the gate metal layer has a width WGM2.

In some embodiments, because a side where the gate electrode 152 faces toward the drain structure 160 (+Y direction) abuts a side where the gate metal layer 154 faces toward the source drain 140 (−Y direction), the width WO1 of opening 147 may be less than the sum of the width WG of the gate electrode 152 and the width WGM2 of the gate metal layer 154 as shown in FIG. 14. In this embodiment, from a top view projecting the source metal layer 146, the gate metal layer 154 and the gate electrode 152 to the substrate 102, the source metal layer 146 partially overlaps the gate metal layer 154 and the gate electrode 152, respectively. In other embodiments, the width WO1 of the opening 147 may also be greater than the sum of the width WG of the gate electrode 152 and the width WGM2 of the gate metal layer 154 (not shown).

The notch 155 of the gate metal layer 154 exposing the gate electrode 152 may reduce the gate-to-source capacitance ($C_{gs}$). Also, the source metal layer 146 with the opening 147 may further reduce the coverage of the source metal layer 146 and the gate structure 150, and thus the gate-to-source capacitance ($C_{gs}$) may be further reduced to increase the switching speed.

In other embodiments, the width WO1 of the opening 147 may equal to the sum of the width WG of the gate electrode 152 and the width WGM2 of the gate metal layer 154 as shown in FIG. 15. In this embodiment, the opposite sides of the opening 147 substantially align with the side where the gate metal layer 154 faces toward the drain structure 160 (+Y direction) and the side where the gate electrode 152 faces toward the source structure 140 (−Y direction). That is, from a top view projecting the source metal layer 146, the gate metal layer 154 and the gate electrode 152 to the substrate 102, the opening 147 aligns with the gate metal 154 and the gate electrode 152 in order to further reduce the gate-to-source capacitance ($C_{gs}$).

The gate-to-source capacitance ($C_{gs}$) may further be reduced by providing opening in the source metal layer and adjusting the size of the opening to increase the switching speed.

Figure 16:
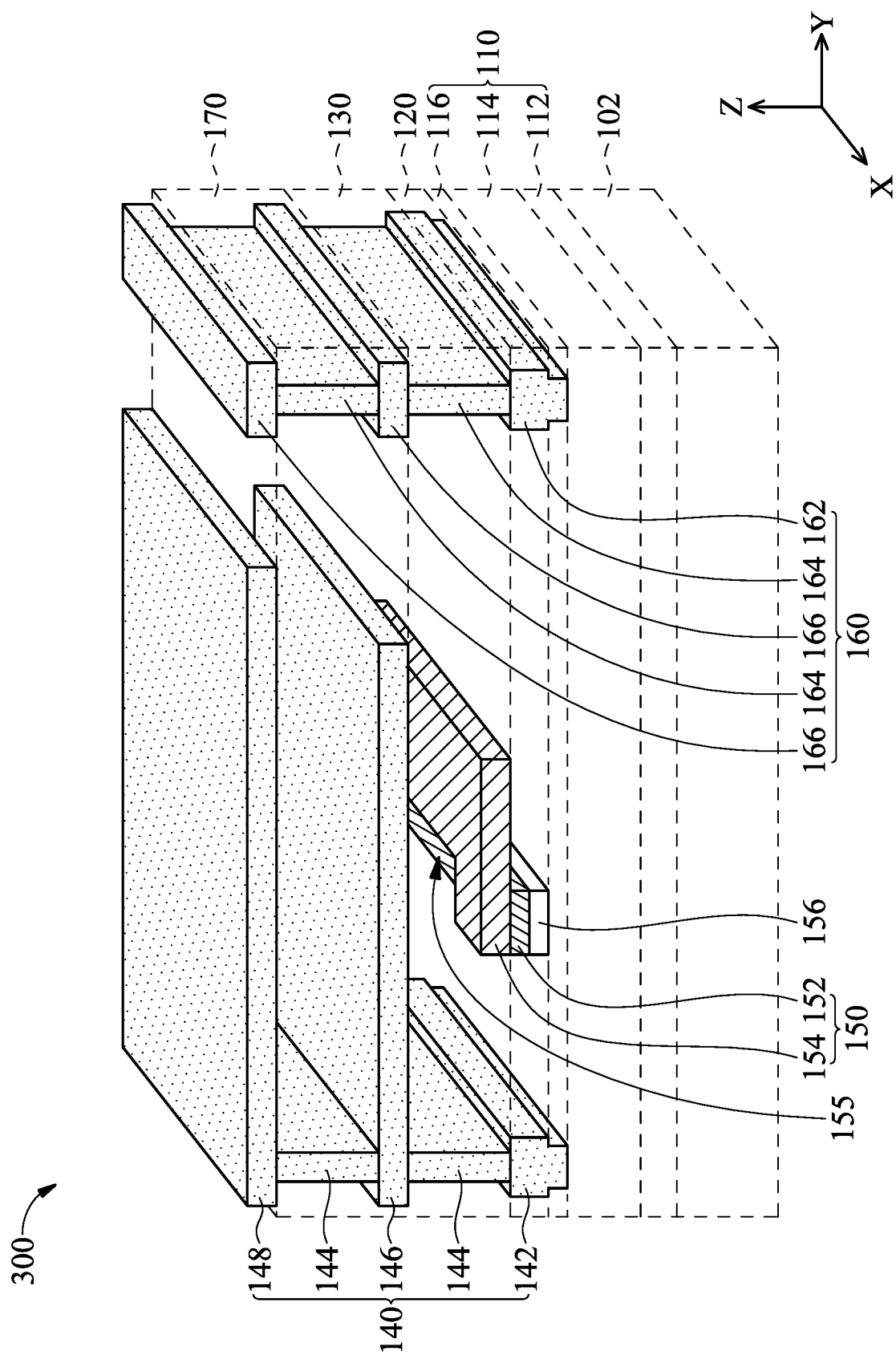
FIG. 16 is a partial perspective view illustrating an exemplary semiconductor structure according to some other embodiments of the present disclosure.

FIG. 16 is a partial perspective view illustrating an exemplary semiconductor structure according to some other embodiments of the present disclosure. FIG. 16 also uses the coordinates shown in FIG. 1 and has an X direction, a Y direction, and a Z direction in order to depict the relative positions.

The semiconductor structure 300 illustrated in FIG. 16 is substantially similar to the semiconductor structure 100 illustrated in FIG. 1, and the difference is that the semiconductor structure 300 illustrated in FIG. 12 further includes an additional source metal layer 148. Specifically, the semiconductor structure 300 further includes the dielectric layer 170 on the dielectric layer 130 and the source metal layer 146, and the source metal layer 148 on the dielectric layer 170.

In some embodiments, the source metal layer 148 may act as an additional source field plate and be electrically connected to the source electrode 142 and the source metal layer 146 by the source contact 144. The electric potential of the source metal layer 146 and 148 electrically connected to the source electrode 142 is different from the electric potential of the gate metal layer 154 electrically connected the gate electrode 152. In this embodiment, the side of the gate electrode 152 faces toward the drain structure 160 (+Y direction) abuts the side of the gate metal layer 154 faces toward the source structure 140 (−Y direction). Also, the width of the additional source metal layer 148 is greater than the width of the source metal layer 146. In other words, the additional source metal layer 148 may fully cover the source metal layer 146.

The notch 155 of the gate metal layer 154 exposing the gate electrode 152 may reduce the gate-to-source capacitance ($C_{gs}$). Also, the additional source metal layer 148 may further reduce electric field. Therefore, in such a case, not only the input capacitance ($C_{gd}+C_{gs}$) is reduced, but the risk of a gate structure suffering from high electric fields is also reduced.

In other embodiment, the width of the additional source metal layer 148 may be less than the width of the source metal layer 146 (not shown). Alternatively, the width of the additional source metal layer 148 may be equal to the width of the source metal layer 146 (not shown). The electric fields and the input capacitances may be reduced at the same time by disposing the additional source metal layer. It should be noted that although merely a single additional source metal layer 148 is shown, the number and size of additional source metal layers may be adjusted according to product design and the required switching speed, and the disclosure is not limited thereto.

Figure 17:
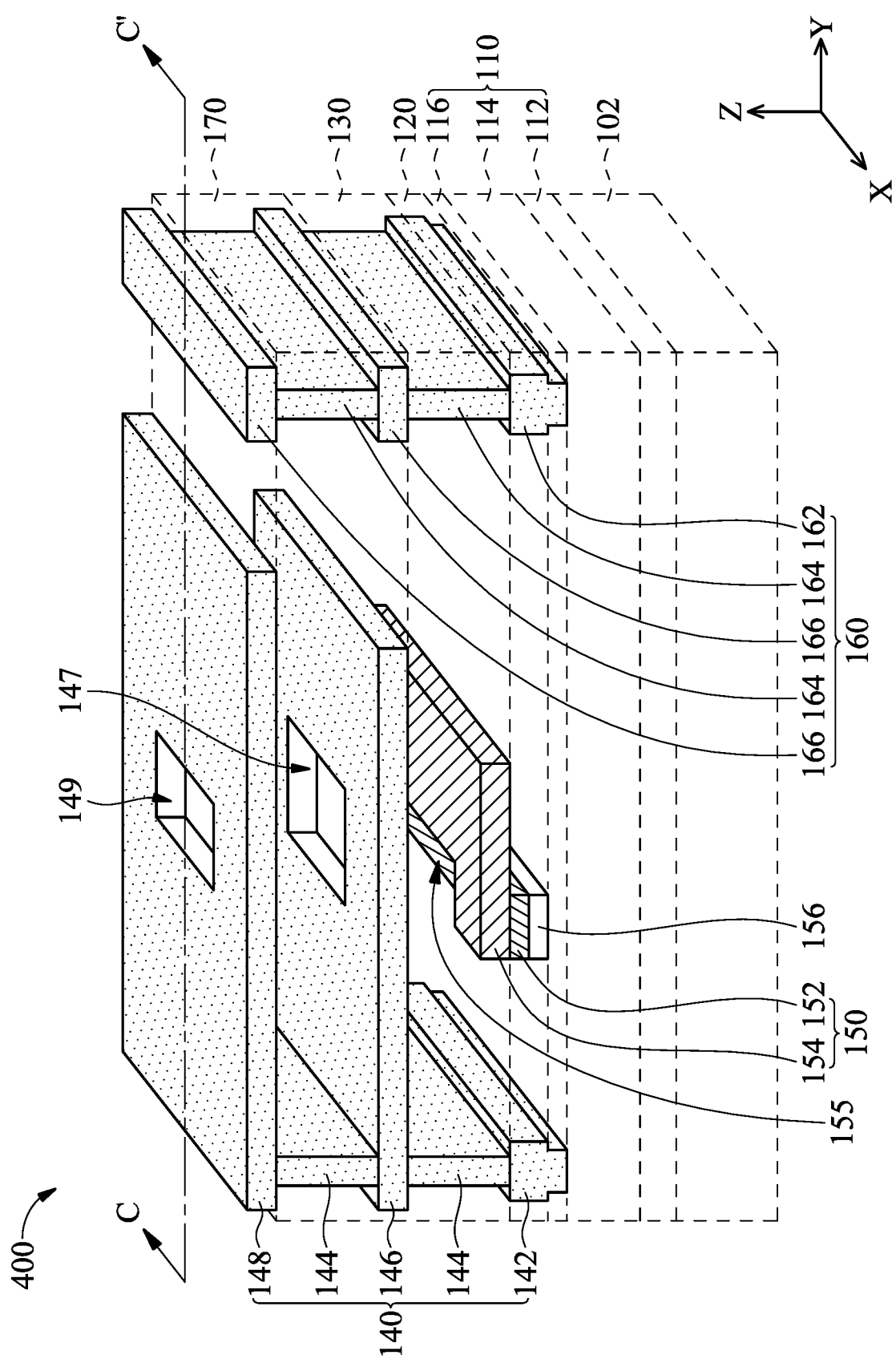
FIG. 17 is a partial perspective view illustrating an exemplary semiconductor structure according to some other embodiments of the present disclosure.
Figure 18:
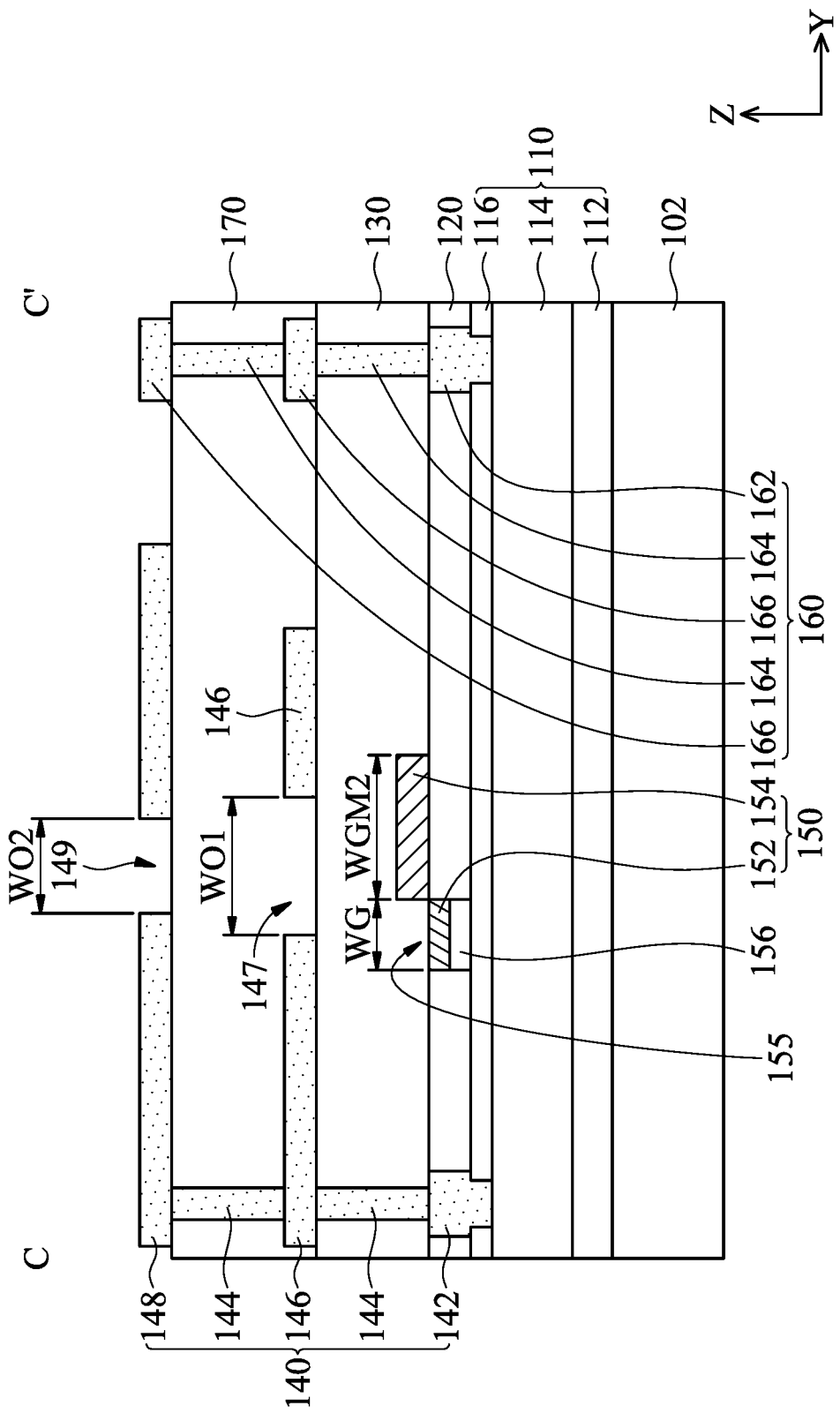
FIG. 18 is a cross-sectional view illustrating a semiconductor structure along line C-C' shown in FIG. 17 according to some other embodiments of the present disclosure.

Referring to FIG. 17 and FIG. 18, FIG. 17 is a partial perspective view illustrating an exemplary semiconductor structure according to some other embodiments of the present disclosure, and FIG. 18 is a cross-sectional view illustrating a semiconductor structure along line C-C' shown in FIG. 17 according to some other embodiments of the present disclosure. FIG. 17 also uses the coordinates shown in FIG. 1 and has an X direction, a Y direction, and a Z direction. FIG. 18 uses the coordinates shown in FIG. 12 and has a Y direction and a Z direction in order to depict relative positions.

The semiconductor structure 400 illustrated in FIG. 17 is substantially similar to the semiconductor structure 100 illustrated in FIG. 1, and the difference is that the source metal layer 146 and the additional source metal layer 148 in the semiconductor structure 400 illustrated in FIG. 17 have openings 147 and 149 respectively, in order to further reduce the gate-to-source capacitance ($C_{gs}$). Specifically, the semiconductor structure 400 includes the source metal layer 146 with the opening 147, the dielectric layer 170 on the source metal layer 146 and the dielectric layer 130, and the source metal layer 148 with the opening 149 on the dielectric layer 170. In the cross-sectional view shown in FIG. 18, the opening 147 of the source metal layer 146 has a width WO1, the opening 149 of the additional source metal layer 148 has a width W02, the gate electrode 152 has a width WG, and the gate metal layer 154 has a width WGM2.

In some embodiments, the width WO2 of the opening 149 may be less than the width WO1 of the opening 147 as shown in FIG. 18. In this embodiment, the side where the gate electrode 152 faces toward the drain structure 160 abuts the side where the gate metal layer 154 faces toward the source structure 140. Also, from a top view projecting the source metal layer 146 and the additional metal layer 148 to the substrate 102, the source metal layer 146 completely overlaps the additional source metal layer 148. The details of the gate electrode 152 and the gate metal layer 154 are similar to the description in FIGS. 13-15 and are not described again herein to avoid repetition.

The notch 155 of the gate metal layer 154 that exposes gate electrode 152 may reduce the gate-to-source capacitance ($C_{gs}$). Also, the opening 147 of the source metal layer 146 may further reduce the gate-to-source capacitance ($C_{gs}$). In addition, the opening 149 of the source metal layer 148 may further reduce the electric field and the gate-to-source capacitance ($C_{gs}$). Therefore, in this way, not only the input capacitance ($C_{gd}+C_{gs}$) is reduced, but the risk of a gate structure suffering from high electric fields is also reduced at the same time.

The electric intensity may be further reduced by the opening in the source metal layer, and the opening in the additional source metal layer. It should be noted that although merely the source metal layer 146 with an opening 147 and the single layer of the additional source layer 148 with an opening 149 are shown, the number and size of the source metal layer and that of the opening in the source metal layer may be adjusted according to product design and the required switching speed, and the disclosure is not limited thereto.

It should be noted that in the semiconductor structure provided by the present disclosure, the number and size of the gate metal layer, and that of the source metal layer, and the number, the size and the shape of the opening in the source metal layer on the gate metal layer are not limited to the above embodiments. For example, various polygons (e.g. pentagons, hexagons, or octagons, and so on), circles, or notches and/or openings having irregular curved contours may also be applied to the semiconductor structure provided in the embodiments of the present disclosure. Depending on the product design and the required switching speed, the number, size, and shape of the notches and/or openings described in the various embodiments described above can be integrated into a single semiconductor structure to adjust the degree of coverage of the source metal layer which serves as a source field plate to the gate metal layer which serves as a gate field plate and the degree of coverage of the gate metal layer which serves as a gate field plate to the 2DEG.

In summary, the present disclosure provides embodiments of a semiconductor structure which reduces the risk of the gate structure being suffered from a high electric field by the gate field plate, and optimizes the electric field distribution and reduces the gate-to-drain capacitance ($C_{gd}$) by the source field plate. Moreover, by forming a notch in the gate metal layer to adjust the coverage of the source field plate to the gate field plate and the coverage of the gate field plate to 2DEG in order to reduce the gate-to-source capacitance ($C_{gs}$) and the gate-to-drain capacitance ($C_{gd}$) at the same time, thereby achieving the purpose of reducing switching loss. Therefore, the semiconductor structure provided by the embodiments of the present disclosure not only has a good balance between the breakdown voltage and the input capacitance ($C_{gd}+C_{gs}$), but also effectively reduces the switching loss, thereby improving the performance of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a channel layer on the substrate;
   a barrier layer on the channel layer;
   a gate structure on the substrate, comprising:
      a gate electrode on the substrate; and
      a gate metal layer on the gate electrode, wherein the gate metal layer has at least one notch, and the gate metal layer exposes the gate electrode from a top view projecting the gate electrode and the gate metal layer onto the substrate, wherein in a normal direction of the substrate, a side surface of the gate electrode and a side surface of the gate metal layer are coplanar;
   a dielectric layer disposed in the at least one notch of the gate metal layer;
   a source structure and a drain structure on opposite sides of the gate structure, wherein the source structure and the drain structure comprise a source electrode and a drain electrode, respectively, wherein the source electrode and the drain electrode both penetrate through the barrier layer and contact the channel layer, wherein an electric potential of the gate structure is different from an electric potential of the source structure; and
   a doped compound semiconductor layer disposed on the substrate, wherein a side surface of the doped compound semiconductor layer is aligned with the side surface of the gate electrode and the side surface of the gate metal layer, wherein the doped compound semiconductor layer is doped with a p-type dopant or an n-type dopant,
   wherein a top surface of the source electrode is coplanar with a top surface of the gate electrode, wherein the source electrode has the top surface wider than a bottom surface, wherein a combined thickness of the gate electrode and the doped compound semiconductor layer is less than a thickness of the source electrode.

2. The semiconductor structure as claimed in claim 1, wherein the at least one notch faces toward a direction of the source structure in a horizon direction.

3. The semiconductor structure as claimed in claim 1, wherein the at least one notch has a shape of a rectangle, a trapezoid or a triangle.

4. The semiconductor structure as claimed in claim 1, wherein a width of the gate metal layer varies linearly along an extension direction of the gate electrode.

5. The semiconductor structure as claimed in claim 1, wherein the at least one notch exposes a first side of the gate electrode and covers a second side opposite to the first side of the gate electrode.

6. The semiconductor structure as claimed in claim 1, wherein the at least one notch exposes a first side of the gate electrode and aligns with a second side opposite to the first side of the gate electrode.

7. The semiconductor structure as claimed in claim 1, wherein a length of the gate metal layer on opposite sides of the at least one notch is greater than or equal to five times of a thickness of the gate metal layer.

8. The semiconductor structure as claimed in claim 1, wherein the source structure further comprises:
   a source metal layer on the source electrode and electrically connected to the source electrode.

9. The semiconductor structure as claimed in claim 8, wherein the source metal layer extends toward the drain structure and extends beyond the gate metal layer.

10. The semiconductor structure as claimed in claim 8, wherein the source metal layer has at least one opening.

11. The semiconductor structure as claimed in claim 8, wherein the source structure further comprises an another source metal layer on the source metal layer, wherein the another source metal layer is electrically connected to the source electrode.

12. The semiconductor structure as claimed in claim 11, wherein the another source metal layer extends toward the drain structure and extends beyond the source metal layer.

13. The semiconductor structure as claimed in claim 11, wherein the another source metal layer has at least one opening.

14. The semiconductor structure as claimed in claim 13, wherein a width of the at least one opening of the another source metal layer is less than a width of an opening of the source metal layer.

15. The semiconductor structure as claimed in claim 1, wherein the gate electrode has a first side surface and a second side surface opposite to the first side surface, wherein in the normal direction of the substrate, the first side surface of the gate electrode and a first side surface of the gate metal layer are coplanar, and the second side surface of the gate electrode and a second side surface of the gate metal layer are coplanar.

16. The semiconductor structure as claimed in claim 1, wherein in a cross-sectional view, the dielectric layer covers an entire top surface of the gate electrode.

\* \* \* \* \*